(12) United States Patent
Cao et al.

(10) Patent No.: US 8,379,991 B2
(45) Date of Patent: Feb. 19, 2013

(54) DELTA TCC FOR FAST SENSITIVITY MODEL COMPUTATION

(75) Inventors: Yu Cao, Cupertino, CA (US); Jun Ye, Palo Alto, CA (US); Wenjin Shao, Sunnyvale, CA (US); Hua Cao, Dublin, CA (US)

(73) Assignee: ASML Netherlands B.V., Veldhoven (NL)

( * ) Notice: Subject to any disclaimer, the term of this patent is extended or adjusted under 35 U.S.C. 154(b) by 493 days.

(21) Appl. No.: 12/614,180

(22) Filed: Nov. 6, 2009

(65) Prior Publication Data

US 2010/0260427 A1    Oct. 14, 2010

Related U.S. Application Data

(60) Provisional application No. 61/113,024, filed on Nov. 10, 2008.

(51) Int. Cl.
*G06K 9/68*    (2006.01)
(52) U.S. Cl. ........................................................ 382/218
(58) Field of Classification Search .................. None
See application file for complete search history.

(56) References Cited

U.S. PATENT DOCUMENTS

| | | | |
|---|---|---|---|
| 6,046,792 A | 4/2000 | Van Der Werf et al. | |
| 6,738,859 B2 | 5/2004 | Liebchen | |
| 6,795,163 B2 | 9/2004 | Finders | |
| 6,871,337 B2 | 3/2005 | Socha | |
| 6,977,714 B2 | 12/2005 | Finders | |
| 7,079,223 B2 | 7/2006 | Rosenbluth et al. | |
| 7,242,459 B2 | 7/2007 | Shi et al. | |
| 7,245,354 B2 | 7/2007 | Granik | |
| 7,425,397 B2 | 9/2008 | Finders et al. | |
| 7,440,082 B2 | 10/2008 | Shi et al. | |
| 7,587,704 B2 | 9/2009 | Ye et al. | |
| 7,873,204 B2 | 1/2011 | Wihl et al. | |
| 2002/0062206 A1 | 5/2002 | Liebchen | |
| 2002/0154281 A1 | 10/2002 | Finders | |
| 2004/0012775 A1* | 1/2004 | Kinney et al. | 356/237.2 |
| 2005/0024616 A1 | 2/2005 | Finders | |
| 2005/0168498 A1 | 8/2005 | Granik | |
| 2005/0179886 A1 | 8/2005 | Shi et al. | |
| 2005/0185159 A1 | 8/2005 | Rosenbluth et al. | |
| 2007/0059614 A1 | 3/2007 | Finders et al. | |
| 2007/0247610 A1* | 10/2007 | Shi et al. | 355/77 |
| 2008/0152212 A1* | 6/2008 | Feldman | 382/144 |
| 2008/0170773 A1 | 7/2008 | Wihl et al. | |

FOREIGN PATENT DOCUMENTS

| | | |
|---|---|---|
| CN | 1683998 | 10/2005 |
| EP | 1 202 119 | 5/2002 |
| EP | 1 719 019 | 11/2006 |
| JP | 2002-184688 | 6/2002 |

(Continued)

OTHER PUBLICATIONS

Chinese Office Action dated Feb. 14, 2012 in corresponding Chinese Patent Application No. 200910221068.1.

(Continued)

*Primary Examiner* — Bhavesh Mehta
*Assistant Examiner* — Nirav G Patel
(74) *Attorney, Agent, or Firm* — Pillsbury Winthrop Shaw Pittman LLP

(57) ABSTRACT

A method for determining a difference between a reference image and a further image of a pattern, the method including determining a reference imaging function; determining parameters of a difference function representative of a difference between the reference imaging function and a further imaging function; calculating a difference between the reference image and the further image of the pattern based on the difference function and the determined parameters.

18 Claims, 11 Drawing Sheets

FOREIGN PATENT DOCUMENTS

| | | |
|---|---|---|
| JP | 2002-329645 | 11/2002 |
| JP | 2004-103674 | 4/2004 |
| JP | 2005-217430 | 8/2005 |
| JP | 2005-234571 | 9/2005 |
| JP | 2007-081393 | 3/2007 |
| WO | 2005/078528 | 8/2005 |
| WO | 2008/086528 | 7/2008 |

OTHER PUBLICATIONS

Japanese Office Action dated Jan. 5, 2012 in corresponding Japanese Patent Application No. 2009-248812.

\* cited by examiner

DELTA TCC FOR FAST SENSITIVITY MODEL COMPUTATION

CROSS-REFERENCE TO RELATED APPLICATIONS

The present application claims priority to U.S. Prov. Appln. No. 61/113,024 filed Nov. 10, 2008, the contents of which are incorporated herein by reference in their entirety.

FIELD

The present invention generally relates to a method and computer product for performing simulations of imaging results associated with a lithographic process.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

The manufacturing process of an integrated circuit involves imaging multiple layers of circuit patterns onto a semiconductor wafer. To address the increasingly demanding needs of the semiconductor industry where the dimensions of the circuit elements are continually being reduced, technologies such as customized illumination schemes, phase shifting masks, and optical proximity correction (OPC) may be used. Numerical methods known as "computational lithography" are often required to simulate the lithography process to ensure the printed patterns meet the design target and to keep experimental costs under control. It is desirable that these numerical methods be highly accurate in order to predict the changes in aerial images (AIs) and critical dimensions (CDs) caused by small perturbations, also known as "sensitivities", to the optical settings.

SUMMARY

It is desirable to provide a method that accurately and rapidly simulates the change in the imaging of arbitrary mask patterns resulting from variations in the optical setting of an optical system In accordance with an aspect of the invention, there is provided a method for determining a difference between a reference image and a further image of a pattern, the method including determining a reference imaging function; determining parameters of a difference function representative of a difference between the reference imaging function and a further imaging function; calculating a difference between the reference image and the further image of the pattern based on the difference function and the determined parameters.

In one embodiment of the invention, the further imaging function is determined based upon the reference imaging function and the difference function.

In one embodiment of the invention, the further imaging function is determined by concatenating the reference imaging function and the difference function. In a further embodiment of the invention, calculating the difference in the reference image and the further image of the pattern includes determining the difference in image intensity of the reference image and the further image of the pattern. In addition, calculating the difference in the reference image and the further image of the pattern further may include determining the difference between a measure for critical dimensions in the reference image and the further image.

In another embodiment of the invention, at least a part of the terms of the difference function are represented in eigenfunctions and corresponding eigenvalues, and a simplified difference function is determined by disregarding eigenfunctions and eigenvalues based upon the eigenvalues. In one embodiment of the invention, the simplified difference function includes less than 300 eigenvalues or less than 100 eigenvalues.

In one embodiment of the invention, the reference image models an image of the pattern formed by a reference optical system under reference conditions, and the further image models an image of the pattern formed by a further optical system, or formed by the reference optical system under further conditions, or formed by a modified reference optical system.

In one embodiment of the invention, the difference between the reference image and the further image is decreased by changing the conditions of the further optical system, the reference optical system or the modified reference optical system. The reference optical system may be a projection system of a lithographic exposure apparatus.

In another aspect of the invention, there is provided a computer product having machine executable instructions, the instructions to be executed by a machine to perform a method for determining a change in an image of a mask pattern. In one embodiment, the method includes determining a reference imaging function; determining parameters of a difference function representative of a difference between the reference imaging function and a further imaging function; calculating a difference between the reference image and the further image of the pattern based on the difference function and the determined parameters.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
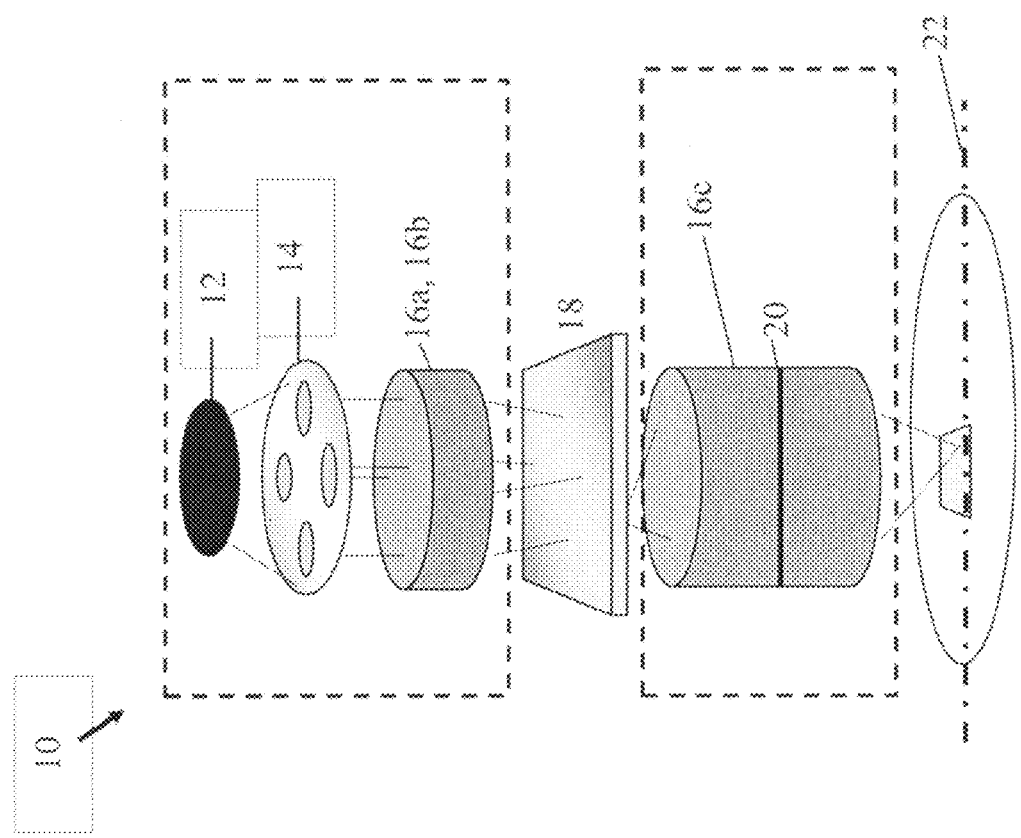
FIG. 1 is an exemplary block diagram illustrating a typical lithographic projection system.

Prior to discussing the present invention, a brief discussion regarding the overall simulation and imaging process to be calibrated is provided. FIG. 1 illustrates an exemplary lithographic projection system 10. The major components are a light or radiation source 12, which may be a deep-ultraviolet excimer laser source, illumination optics which define the partial coherence (denoted as sigma) and which may include specific source shaping optics 14, 16a and 16b; a patterning device (e.g. a mask or reticle) 18; and projection optics 16c that produce an image of the patterning device pattern onto the wafer plane 22. An adjustable filter or aperture 20 at the pupil plane may restrict the range of beam angles that impinge on the wafer plane 22, where the largest possible angle defines the numerical aperture of the projection optics NA=sin($\Theta_{max}$).

Figure 2:
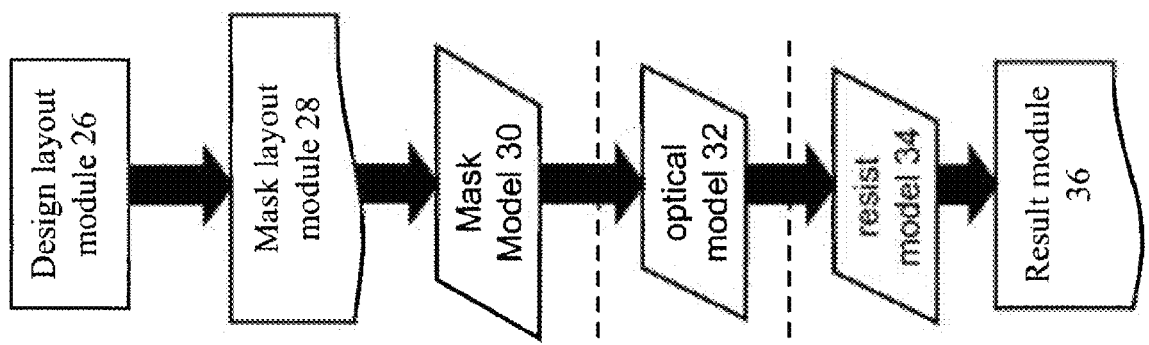
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the patterning device layout module (e.g. mask layout module) 28, which defines the patterning device (e.g. mask) to be utilized in imaging process; the patterning device model module (e.g. mask model module) 30, which defines the model of the patterning device layout (e.g. mask layout) to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. NA and $\sigma$ are known parameters, as will be appreciated by one skilled in the art. The optical properties of the photo-resist layer coated on a substrate—i.e. refractive index, film thickness, propagation and polarization effects—may also be captured as part of the optical model 32. The patterning device model (e.g. mask model) 30 captures the design features of the patterning device (e.g. reticle or mask) and may also include a representation of detailed physical properties of the patterning device (e.g. reticle or mask), as described, for example, in U.S. Pat. No. 7,587,704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC patterning device layout, and will be provided in a standardized digital file format such as GDSII or OASIS.

In general, the connection between the optical and the resist model is a simulated aerial image within the resist layer, which arises from the projection of radiation or light onto the substrate, refraction at the resist interface and multiple reflections in the resist film stack. The light intensity distribution (aerial image) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

As should be therefore apparent from the above, the model formulation describes all of the known physics and chemistry of the overall process, and each of the model parameters corresponds to a distinct physical or chemical effect. The model formulation thus sets an upper bound on how well the model can be used to simulate the overall lithography process. So precise calibration of the model parameters is extremely important.

There are various ways that the model parameters can be defined. One efficient implementation of a lithography model is possible using the following formalism, where the image (here in scalar form, which may be extended to include polarization vector effects) is expressed as a Fourier sum over signal amplitudes in the pupil plane. According to the standard Hopkins theory, the aerial image intensity may be defined by:

$$AI(x) = \sum_k S(k) \left| \sum_{k'} M(k'-k)P(k')\exp(-jk'x) \right|^2 \quad \text{(Eq. 1)}$$

$$= \sum_k S(k) \left\{ \sum_{k'} \sum_{k''} M(k'-k)P(k')M^* \atop (k''-k)P^*(k'')\exp(-j(k'-k'')x) \right\}$$

$$= \sum_{k'} \sum_{k''} \left[ \sum_k S(k)P(k+k')P^*(k+k'') \right]$$

$$M(k')M^*(k'')\exp(-j(k'-k'')x)$$

$$= \sum_{k'} \sum_{k''} TCC_{k',k''} M(k')M^*$$

$$(k'')\exp(-j(k'-k'')x)$$

where, AI(x) is the aerial image intensity at point x within the image plane (for notational simplicity, a two-dimensional coordinate represented by a single variable is utilized), k represents a point on the source plane, S (k) is the source intensity from point k, k' and k'' are points on the pupil plane, M is the Fourier transform of the mask image, P is the pupil function, and $TCC_{k',k''} = \Sigma_k S(k) P(k+k') P^*(k+k'')$.

An important aspect of the foregoing derivation is the change of summation order (moving the sum over k inside) and indices (replacing k' with k+k' and replacing k'' with k+k''), which results in the separation of the Transmission Cross Coefficients (TCCs), defined by the term inside the square brackets in the third line of the equation. These coefficients are independent of the patterning device pattern (e.g. mask pattern) and therefore can be pre-computed using knowledge of the optical elements or configuration only (e.g., NA and σ or the detailed illuminator profile). It is further noted that although in the given example (Eq. 1) is derived from a scalar imaging model, this formalism can also be extended to a vector imaging model, where the polarized light components are summed separately.

Furthermore, the approximate aerial image AI can be calculated by using only a limited number of dominant TCC kernels, which can be determined by diagonalizing the TCC matrix to obtain a diagonalized TCC matrix, also named hereinafter "diagTCC," and retaining (by truncation) the kernels corresponding to its largest eigenvalues, i.e., $$\text{diag}TCC_{k',k''} = \sum_{i=1}^N \lambda_i \phi_i(k') \phi_i^*(k'') \quad \text{(Eq. 2)}$$

where $\lambda_i$ denotes the N largest eigenvalues and $\phi_i(\cdot)$ denotes the corresponding eigenvector of the TCC matrix. It is noted that (Eq. 2) is exact when all kernels are retained in the Eigen series expansion, i.e., when N is equal to the rank of the TCC matrix. However, in actual applications, it is typical to truncate the series by selecting a smaller N (i.e. n) to increase the speed of the computation process. The more kernels kept in the Eigen series, the better accuracy retained, at the cost of more computation. In general, the TCC matrix prior to the diagonalization operation can be referred to as a "raw" TCC matrix, and will be denoted hereinafter "rawTCC."

Thus, (Eq. 1) can be rewritten as:

$$AI(x) = \sum_{k'} \sum_{k''} TCC_{k',k''} M(k')M^*(k'')\exp(-j(k'-k'')x) \quad \text{(Eq. 3)}$$

$$= \sum_{k'} \sum_{k''} \sum_{i=1}^N \lambda_i \phi_i(k') \phi_i^*(k'') M(k')M^*$$

$$(k'')\exp(-j(k'-k'')x)$$

$$= \sum_{i=1}^N \lambda_i \sum_{k'} \phi_i(k') M(k') \exp(-jk'x) \sum_{k''} \phi_i^*$$

$$(k'')M^*(k'')\exp(jk''x)$$

$$= \sum_{i=1}^N \lambda_i |\Phi_i(x)|^2$$

where $$\Phi_i(x) = \sum_{k''} \phi_i(k'') M^*(k'') \exp(-jk''x)$$

and |·| denotes the magnitude of a complex number.

Using a sufficiently large number of TCC kernels and a suitable model calibration methodology allows for an accurate description of the optical projection process and provides an accurate representation of the aerial image. Additional information regarding the calculation of an aerial image can be gleaned from U.S. Pat. No. 6,871,337 issued on Mar. 22, 2005 titled "Illumination Optimization For Specific Mask Patterns", the contents of which is incorporated herein in its entirety by reference.

As will be appreciated, the aerial image AI only depends on the patterning device (e.g. mask) image and the transmission cross-coefficients (TCC). The TCCs capture all the optical characteristics of the optical system. If two models, which correspond to two optical systems, have the same TCCs, then the aerial images from the two models match perfectly for the same patterning device (e.g. mask). If the resist parts of the models are also the same, then the printing results also match perfectly.

In a manufacturing environment, it is often desirable to match the performance of an optical system (e.g. a second scanner or a second projection system in a lithographic exposure apparatus) to a reference optical system (e.g. a first reference scanner or a first optical system in a lithographic exposure apparatus). Further, it is also desirable to predict the change in the aerial image resulting from a change of the optical setting in a given optical system. This involves tweaking the optical settings on the to-be-tuned optical system, such as the numerical aperture (NA) of the optical system, sigma, stage tilt, and exposure dosage. These changes might be very small. For instance, a change of 0.01 in NA, or 10 mσ in sigma inner/outer values is typical. To predict the changes in aerial images (AIs) and critical dimensions (CDs) caused by such small perturbations, also known as "sensitivities" to the optical settings, highly accurate optical models are needed.

As optical settings are represented by truncated TCC eigen-series, the truncation-induced errors play a significant role in the model sensitivities. Simulation experiments showed that the conventional setting of 64 TCC kernels is inadequate to capture the perturbation with satisfactory accuracy. In fact, for some cases, up to 1024 TCC kernels are used.

One conventional approach that may be used to predict the changes in aerial images and critical dimensions (1) from a reference optical system to another optical system or (2) within an optical system involves calculating two sets of aerial images using two TCC series in the following manner:

In the conventional approach, as shown below in Equation 4, first, the reference optical system having a first optical setting (denoted as "state_1") is modeled using a TCC matrix (also denoted, hereinafter, as "rawTCC_1"). The first TCC matrix is then diagonalized and truncated to select the kernels with the greatest eigenvalues. The results of the diagonalization and truncation operations provide a limited number of TCC kernels denoted, hereinafter, as diagTCC_1$|_{large}$. As mentioned previously, typically, a large number of kernels is needed when calculating the aerial image, in order to accurately account for small perturbations. The aerial image (AI (diagTCC_1)$|_{large}$) can be determined using Eq. 3. The critical dimension (CD(diagTCC_1)$|_{large}$) of a given pattern will then be obtained based on the profile of the aerial image (AI(diagTCC_1)$|_{large}$).

$$\text{state\_1} \Rightarrow \text{rawTCC\_1} \Rightarrow \text{diagTCC\_1 }|_{large} \Rightarrow \quad \text{(Eq. 4)}$$
$$AI(\text{diagTCC\_1}) |_{large} \Rightarrow CD(\text{diagTCC\_1}) |_{large}$$

Similar calculations are performed for a second optical setting, as shown in Equation 5. The second optical setting may correspond to the optical setting of a different optical system or the same optical system but in a perturbed state, for instance cause by drift or heating of optical elements. Thus, the optical system having a second optical setting (denoted as "state_2") is modeled using a TCC matrix (also denoted, hereinafter, as "rawTCC_2"). The second TCC matrix is then diagonalized and truncated to select the kernels with the greatest eigenvalues. The results of the diagonalization and truncation operations provide a limited number of TCC kernels denoted, hereinafter, as diagTCC_2$|_{large}$. The aerial image (AI(diagTCC_2)$|_{large}$) can be determined using Eq. 3. The critical dimension (CD(diagTCC_2)$|_{large}$) of a given pattern will then be obtained based on the profile of the aerial image.

$$\text{state\_2} \Rightarrow \text{rawTCC\_1} \Rightarrow \text{diagTCC\_2 }|_{large} \Rightarrow \quad \text{(Eq. 5)}$$
$$AI(\text{diagTCC\_2}) |_{large} \Rightarrow CD(\text{diagTCC\_2}) |_{large}$$

The critical dimension sensitivity resulting from the changes in optical setting between the reference optical system and the second optical system or between different optical settings within a given optical system can be calculated in the following manner:

$$\Delta CD = CD(\text{diag}TCC\_2)|_{large} - CD(\text{diag}TCC\_1)|_{large}$$

While the above method for calculating changes in critical dimensions resulting from small perturbations provide good results when a large number of kernels are selected (typically up to 1024 TCC kernels), this is done at the expense of the computation speed and, thus, the simulation throughput. It is therefore desirable to provide an approach that can accurately and rapidly determine variations in an aerial image resulting from small perturbations in the optical settings.

In one embodiment of the invention, instead of using two optical models with extremely large sets of TCC kernels to describe the corresponding optical settings and compute the sensitivities, two small sets of TCC kernels are calculated. The first set of TCC kernels describes a reference imaging function, which may correspond to one of the optical system states (denoted as "base state" below), and the second set, referred to as "ΔTCC", describes a difference imaging function representative of the change in optical settings. A further imaging function is calculated by creating a new set of TCC kernels using the reference imaging function (first set of TCC kernels) and the difference imaging function (second set of TCC kernels). The new set of TCC kernels may be representative of a second optical system state (denoted as "perturbed state" below). The two TCC sets, i.e. the new set of TCC kernels representative of the perturbed state and the set of TCC kernels representative of the base state are then used for sensitivity calculation.

In one embodiment of the invention, the base state and the perturbed state are representative of different optical settings of different optical systems (e.g. a first or reference lithographic apparatus and a second or further lithographic apparatus). Alternatively, the base state and the perturbed state are representative of different optical settings of a same optical system. The optical setting may be described by various parameters including, for example, the numerical aperture of the optical system, the exposure dose, and the profile of illumination in an illuminator (characterized, e.g., by $\sigma_{inner}$ and $\sigma_{outer}$). It will be appreciated that additional parameters can be used to characterize the change of optical settings in other embodiments of the invention.

Figure 3:
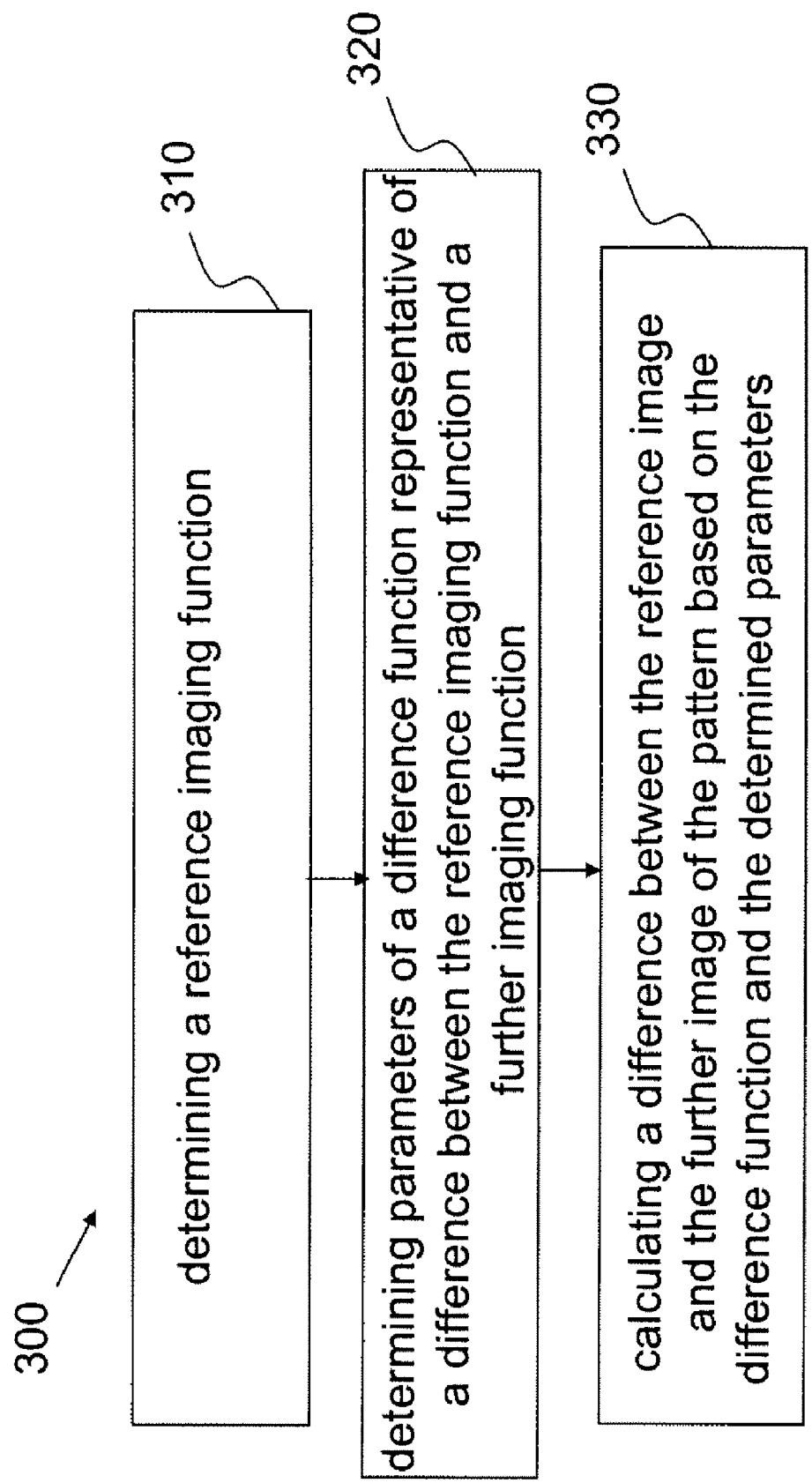
FIG. 3 is a flowchart representing a method for determining a difference between a reference image and a further image of a pattern, in accordance with an embodiment of the invention.

Referring now to FIG. 3, this figure shows a method 300 for determining a difference between a reference image and a further image of a pattern. The method 300 begins at procedure 310 where a reference imaging function is determined. The reference imaging function may be representative of a base state ("state_1") of a first or reference optical system. The reference imaging function can be constructed by (a) using a first matrix of transmission cross-coefficients ($TCC_{k,k'}$) defined by $$\text{rawTCC\_1}_{k',k''} = \sum_k S(k) P(k+k') P^*(k+k''),$$

where S(k) is the source intensity of the first optical system and P(k) is the pupil function of the first optical system, and by (b) diagonalizing that first matrix of transmission cross-coefficients (rawTCC_1$_{k,k'}$) to obtain a diagonalized first set of transmission cross-coefficient kernels (diagTCC_1$_{k,k'}$) defined by diagTCC_1$_{k',k''}=\Sigma_{i=1}^{N}\lambda_i\phi_i(k')\phi_i^*(k'')$, where $\lambda_i$ (i=1, . . . , N) are the N largest eigenvalues and $\phi_i$ are the corresponding eigenvectors. The diagonalized matrix diagTCC_1$_{k,k'}$ is truncated to retain a small number of TCC kernels with the highest eigenvalues, which would have the largest contribution to imaging. The truncation operation provides a matrix of TCC kernels denoted as "diag TCC_1$_{k,k'}|_{small}$," which corresponds to the reference imaging function. Typically, the number n of selected TCC kernels will depend upon the properties of the optical system, the nature of the optical change, geometry of the mask patterns to be imaged, and the required level of accuracy. In one embodiment, the number n of TCC kernels may be less than about 300. In another embodiment, the number n of TCC kernels may be less than about 100.

After calculating the reference imaging function, the method proceeds to procedure 320, where parameters of a difference function representative of a difference between the reference imaging function and a further imaging function are determined. The difference function is representative of a change in the optical settings from the base state to a perturbed state. As noted previously, the base state and the perturbed state may be representative of different optical settings of either (a) different optical systems or (b) a same optical system. In one embodiment, the difference function is calculated by determining the difference (ΔrawTCC) between the first matrix of transmission cross-coefficients (rawTCC_$1_{k,k'}$) representative of the base state of, for example, a first optical system and a second matrix of transmission cross-coefficients (rawTCC_$2_{k,k'}$) representative of the perturbed state. The perturbed state may be associated with a second or further optical system or the same optical system. The second matrix of transmission cross-coefficients (rawTCC_$2_{k,k'}$) is defined by $$\text{rawTCC}\_2_{k',k''} = \sum_k S(k)P(k+k')P^*(k+k'').$$

Thus, the difference function ΔrawTCC=rawTCC_$2_{k,k'}$−rawTCC_$1_{k,k'}$. In practice, the difference function ΔrawTCC corresponds to a matrix of transmission cross-coefficients.

The difference function (ΔrawTCC) between the first matrix of transmission cross-coefficients (rawTCC_$1_{k,k'}$) representative of the base state of, for example, a first optical system and the second matrix of transmission cross-coefficients (rawTCC_$2_{k,k'}$) representative of the perturbed state provides a matrix of transmission cross-coefficients, which is diagonalized and truncated. Similarly to the reference imaging function, a truncation operation is performed to retain a small number n' of TCC kernels, denoted as "ΔdiagTCC$_{k,k'}|_{small}$", having the highest eigenvalues. The number n' of TCC kernels will depend upon the properties of the optical system, the nature of the optical change, geometry of the mask patterns to be imaged, and the required level of accuracy. In one embodiment, the number n' of TCC kernels may be less than about 300. In another embodiment, the number n' of TCC kernels may be less than about 100. In one embodiment, the number n of kernels selected at procedure 310 may be the same as the number n' of kernels selected at procedure 320. In other embodiment, the number n can be smaller or greater than n'. The truncation operation provides a simplified difference function.

The further imaging function is based upon the reference imaging function and the difference function. In one embodiment, the further imaging function is determined by concatenating the reference imaging function and the difference function. For example, the further imaging function, denoted as diagTCC_$1_{k,k'}|_{small}$: ΔdiagTCC$_{k,k'}|_{small}$, is created using the reference imaging function diagTCC_$1_{k,k'}|_{small}$ and the difference function ΔdiagTCC$_{k,k'}|_{small}$, where the ":" sign denotes a combination of the two sets of diagonalized TCC kernels. For example, in one embodiment, the further imaging function is created by concatenating the set of TCC kernels diagTCC_$1_{k,k'}|_{small}$ and the set of TCC kernels ΔdiagTCC$_{k,k'}|_{small}$. The further imaging function is representative of the perturbed state and is used to calculate the aerial images AI(diagTCC_$1_{k,k'}|_{small}$: ΔdiagTCC$|_{small}$) and critical dimensions CD(diagTCC_$1_{k,k'}|_{small}$ ΔdiagTCC$_{k,k'}|_{small}$) of the mask pattern.

Referring back to FIG. 3, the method proceeds to procedure 330 where a difference between the reference image and the further image of the pattern based on the difference function and the determined parameters are calculated. In one embodiment, calculating the difference in the reference image and the further image of the pattern includes determining the difference in image intensity of the reference image and the further image of the pattern. Further, calculating the difference in the reference image and the further image of the pattern may include determining the difference between a measure for critical dimensions in the reference image and the further image.

For example, the aerial image sensitivity ΔAI is calculated by determining the difference between the aerial image determined using the further imaging function and the aerial image determined using the reference imaging function. Thus, ΔAI=AI(diagTCC_$1_{k,k'}|_{small}$: ΔdiagTCC$|_{small}$)−AI((diagTCC_$1_{k,k'}|_{small}$). The critical dimension sensitivity can be deduced from the aerial image sensitivity by calculating the difference between the critical dimension determined using the further imaging function CD(diagTCC_$1_{k,k'}|_{small}$: ΔdiagTCC$_{k,k'}|_{small}$) and the critical dimension determined using the reference imaging function CD(diagTCC_$1_{k,k'}|_{small}$).

In one embodiment, the difference between the reference image and the further image is decreased by changing the conditions of the further optical system, the reference optical system or the modified reference optical system.

In the approach defined in the embodiment of FIG. 3, the perturbation is treated "separately", as opposed to the conventional approach where the perturbation is coupled with the baseline aerial images. The reasoning is that the difference function ΔdiagTCC$_{k,k'}|_{small}$ corresponding to the perturbation will typically have a smaller rank, and can therefore be sufficiently accurately approximated by a smaller number of TCC kernels, as opposed to the complete TCC matrices that take many more TCC kernels to capture the sensitivity effectively.

There are numerous benefits of the approach of FIG. 3. Compared to conventional approaches, keeping less kernels during TCC diagonalization saves computation time significantly. It will be appreciated that, using the method of FIG. 3, a reduction in computation time by at least a factor of 3, and in some embodiments, a factor of 8, can be obtained. In addition, the memory consumption is significantly reduced. Indeed, using less TCC kernels requires less memory in use (for example, 16× for 64 TCC kernels vs. 1024 TCC kernels) at run time, which in turn allows more simulation tasks running in parallel on a same computational platform. This is particularly important for applications where multiple optical conditions need to be simulated simultaneously, and therefore multiple TCC's need to be held in memory. There is more flexibility in simulation job set-up. Using the approach of the embodiment of FIG. 3, users may be able to concatenate a difference function, ATCC, to an existing TCC and calculate aerial images AIs or critical dimensions, CDs, without the full knowledge of the numerical settings for the existing TCC. For example, one may perturb a base model using the present invention and generate a new model, which has the required sensitivity accuracy, and converges to the existing model when the perturbation approaches zero. These benefits will be further illustrated in FIGS. 4a-d and FIGS. 5a-d.

Figure 4B:
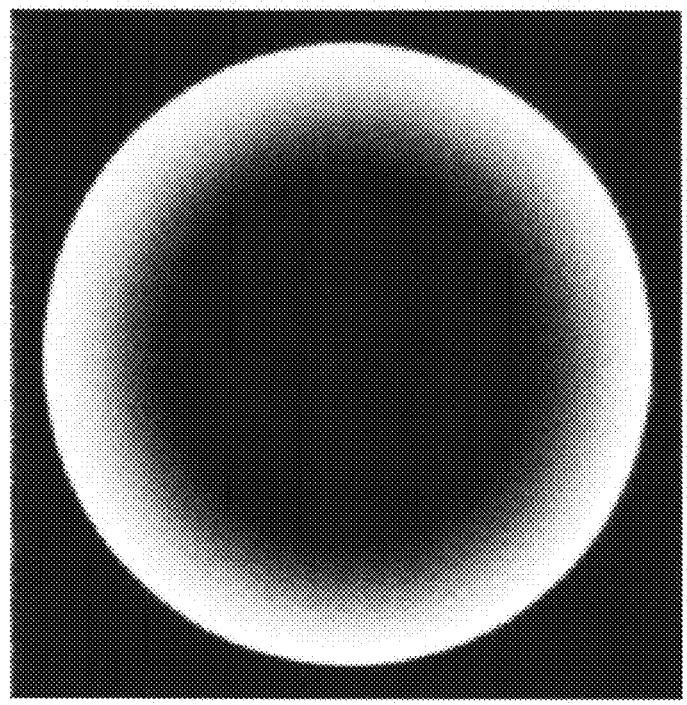
FIGS. 4a-b show two different intensity profiles of an illumination system.
Figure 4A:
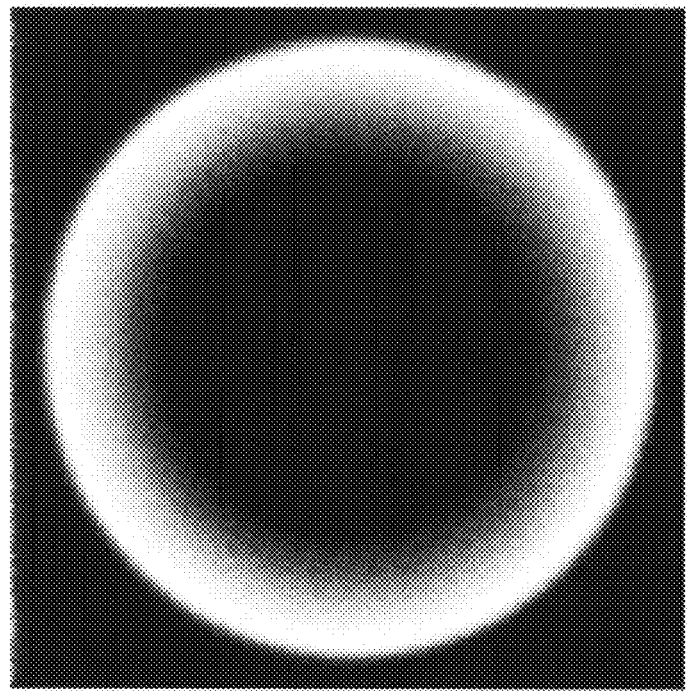

FIGS. 4a-d show critical dimension sensitivity calculations (FIGS. 4c and 4d) for two different intensity profiles of an illuminator (FIGS. 4a and 4b). The mask pattern used in the simulation is an array of 50 nm lines arranged in various pitches ranging from 100 nm to 1000 nm. The intensity profiles in FIGS. 4a-b differ from each other in that the σ$_{outer}$ slope of the intensity profile of FIG. 4b is 3 times as sharp as the $\sigma_{outer}$ slope of the intensity profile of FIG. 4a.

Figure 4C:
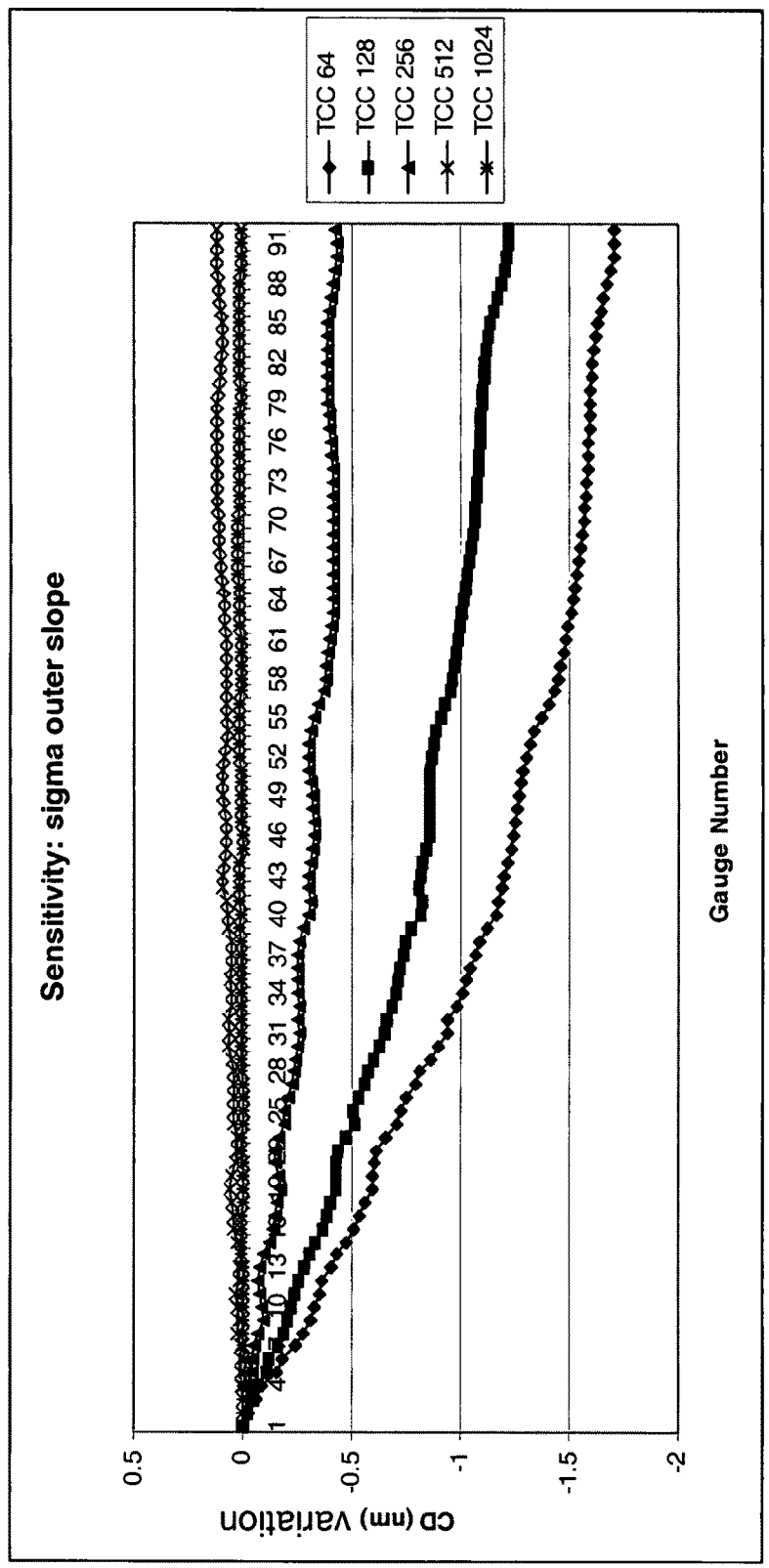
FIG. 4c shows the image sensitivity to the illumination change as calculated using a conventional method.

FIG. 4c shows the variations of critical dimensions induced by a change in the optical settings calculated using (a) an infinite or very large number of diagonalized transmission cross coefficient kernels, or the undiagonalized rawTCC and (b) a limited number of TCC kernels for different gauges using a conventional approach. Each point in the curve represents a single gauge. Each gauge corresponds to a pattern. The baseline, i.e. ΔCD (delta critical dimension)=0, corresponds to the ideal result obtained using an infinite or very large number of transmission cross-coefficient kernels when calculating the image sensitivity that results from the change in illuminator intensity profile using a conventional approach. Thus, when ΔCD=0 for each gauge, the aerial image sensitivity is accurately determined and there is no difference between an aerial image calculated with an infinite or very large number of transmission cross coefficient kernels and an aerial image calculated with a limited number of transmission cross coefficient kernels. As shown in FIG. 4c, it is desirable to use at least 1024 TCC kernels to obtain satisfactory results for each gauge using the conventional approach. If the number of TCC kernels is reduced (from 1024 to 512, to 256, to 128 and to 64), the difference between the results obtained using a very large number of transmission cross-coefficient kernels (baseline) and a limited number of transmission cross-coefficient kernels increases significantly.

Figure 4D:
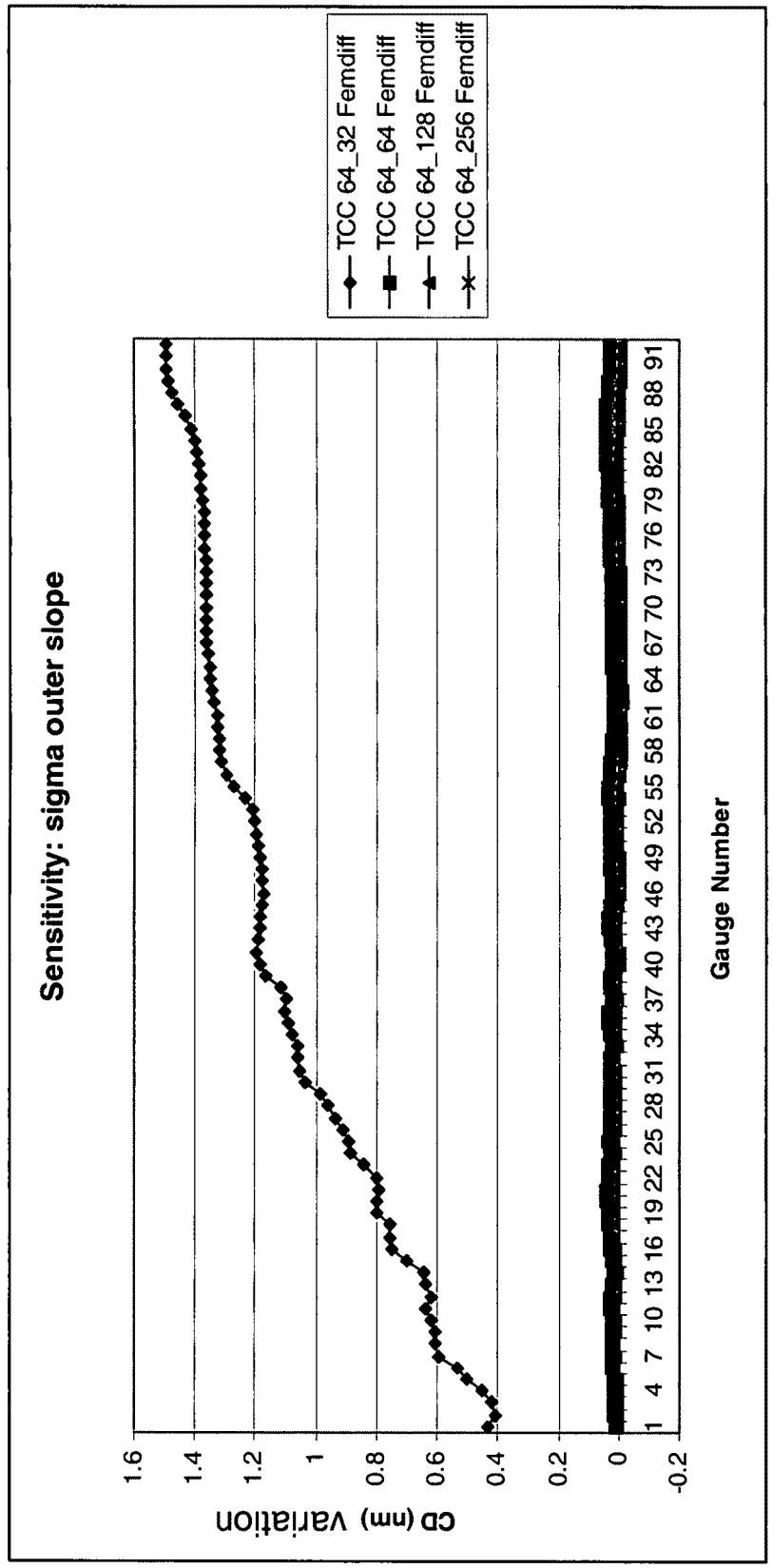
FIG. 4d shows the image sensitivity to the illumination change as calculated using the method of FIG. 3.

FIG. 4d differs from FIG. 4c in that the difference in sensitivity is calculated in accordance with the method of FIG. 3. In FIG. 4c, the number of TCC kernels corresponding to the base state (i.e. the intensity profile of FIG. 4a) is 64. Each curve corresponds to a different number of TCC kernels in the difference function, i.e. $\Delta diagTCC_{k,k'}|_{small}$. This number varies from 32 to 256. As can be seen in FIG. 4d, it is possible to obtain results that match those obtained with an infinite number of TCC kernels by using only 64 TCC kernels for the difference function and 64 TCC kernels for the base state. Thus, instead of using 1024 TCC kernels with the conventional approach, it is possible to obtain similar results with only 64 TCC kernels for the base state and 64+64=128 kernels for the perturbed state. Thus, it will be appreciated that the computation time is significantly reduced with the method of FIG. 3 and that less memory is needed.

Figure 5B:
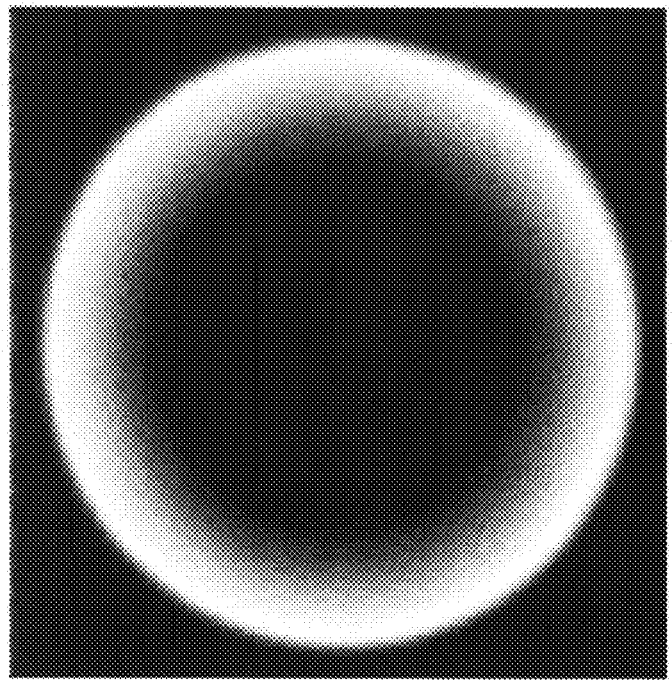
FIGS. 5a-b show two different intensity profiles of an illumination system.
Figure 5A:
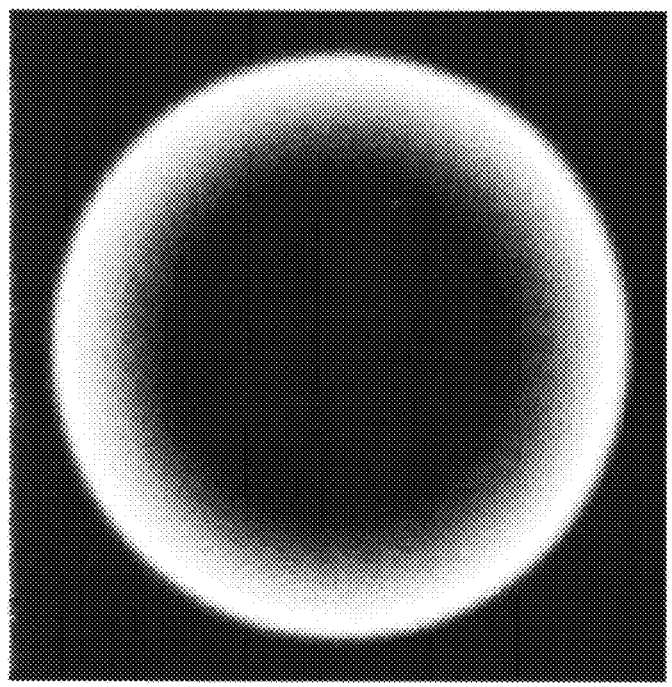
Figure 5C:
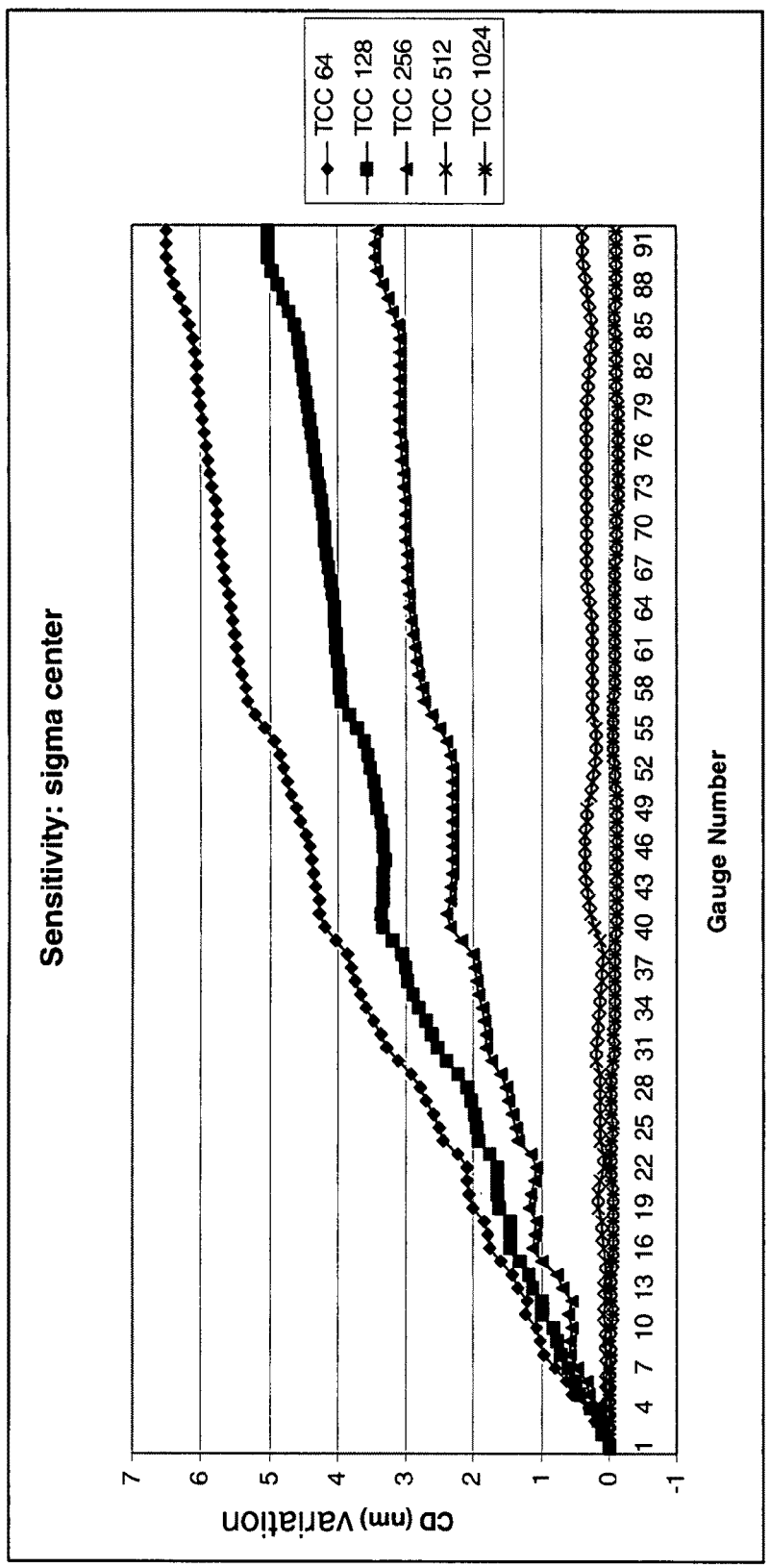
FIG. 5c shows the image sensitivity to the illumination change as calculated using a conventional method.
Figure 5D:
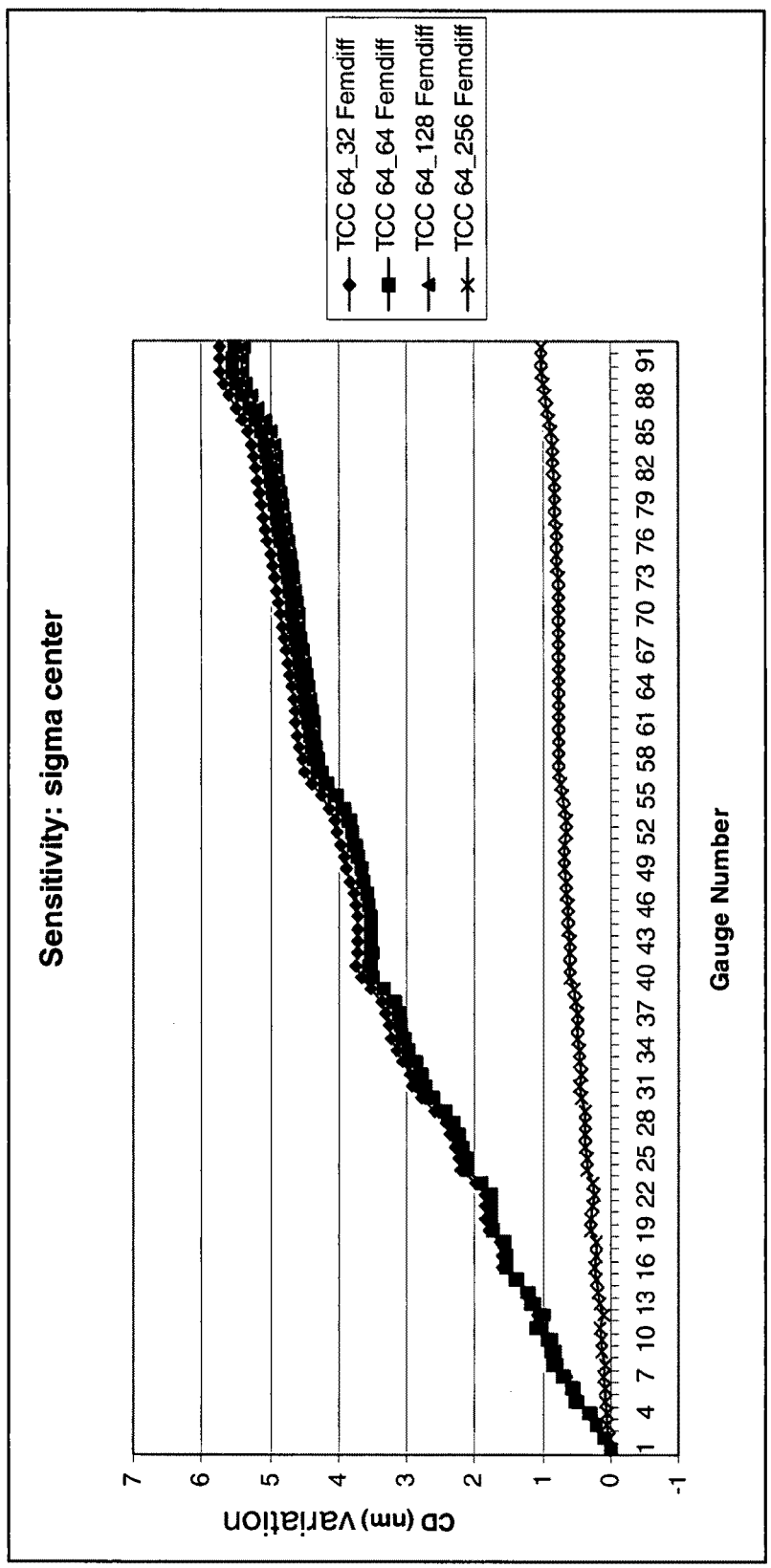
FIG. 5d shows the image sensitivity to the illumination change as calculated using the method of FIG. 3.

Calculations similar to those of FIGS. 4c-d were performed for other changes in intensity profiles shown in FIGS. 5a-b. Sensitivity calculations are shown in FIGS. 5c-d. The intensity profile of FIG. 5a corresponds to an annular shape having a $\sigma_{outer}$ of 0.96 and a $\sigma_{inner}$ of 0.76. The intensity profile of FIG. 5b corresponds to an annular shape having a $\sigma_{outer}$ of 0.997 and a $\sigma_{inner}$ of 0.797. Calculations were performed for the same mask pattern as in FIGS. 4a-d.

As can be seen in FIG. 5c, it is desirable to use at least 512 TCC kernels to accurately determine the change in aerial image with the conventional approach. By contrast, as shown in FIG. 5d, the perturbed state modeled with only about 64+256=320 TCC kernels shows reasonable convergence for all of the gauges. Thus, the same changes as in FIG. 5c can be determined with only about 320 TCC kernels, as opposed to 512 TCC kernels.

Figure 6:
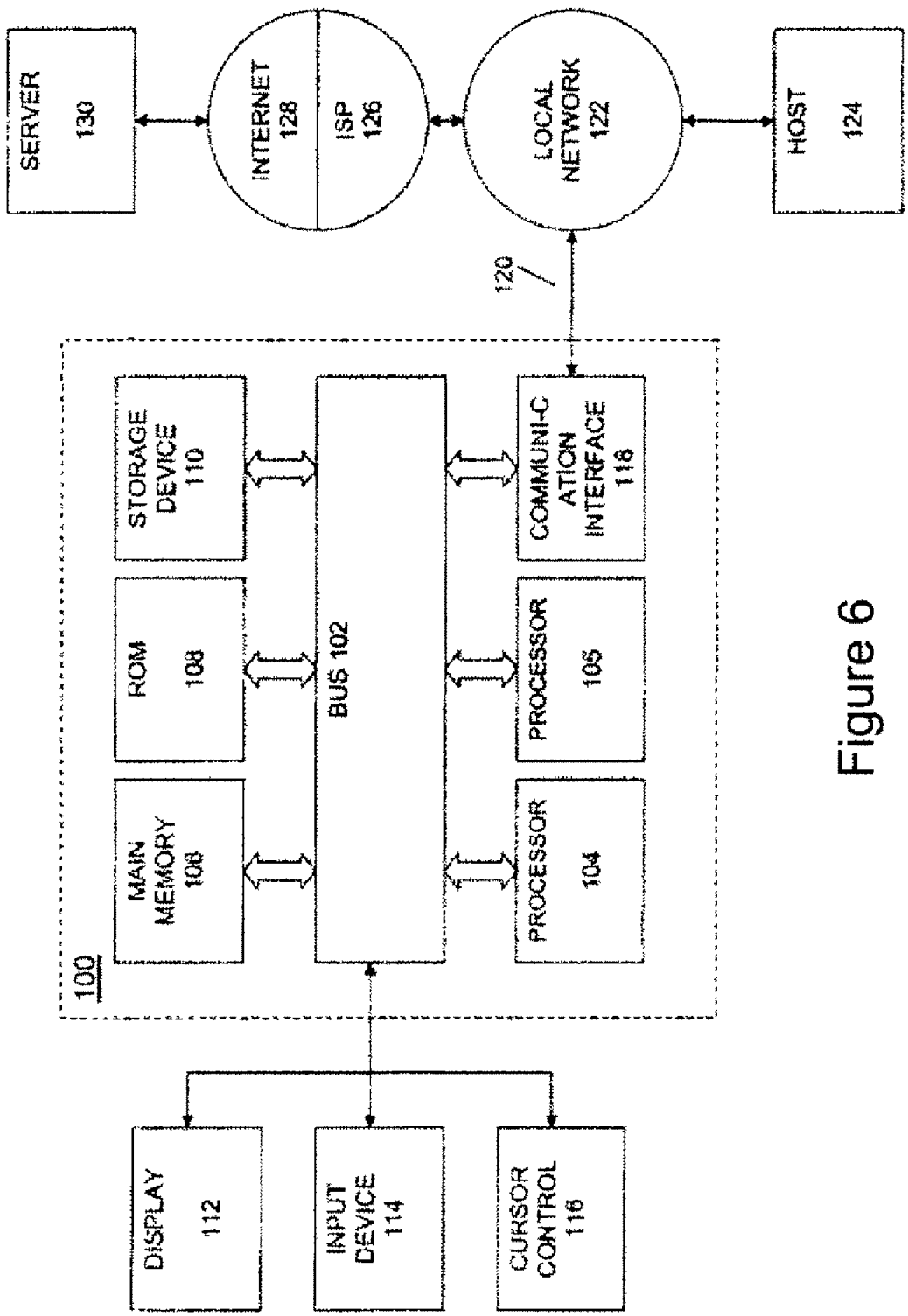
FIG. 6 is a block diagram that illustrates a computer system which can assist in the implementation of the simulation method of the present invention.

FIG. 6 is a block diagram that illustrates a computer system 100 which can assist in implementing the lithographic simulation methods disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media and volatile media. Non-volatile media include, for example, optical or magnetic disks, such as storage device 110. Volatile media include dynamic memory, such as main memory 106. Common forms of computer-readable media include, for example, a floppy disk, a flexible disk, hard disk, magnetic tape, any other magnetic medium, a CD-ROM, DVD, any other optical medium, a RAM, a PROM, and EPROM, a FLASH-EPROM, any other memory chip or cartridge, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the TCC computation of the embodiment, for example. The received code may be executed by processor 104 as it is received, and/or stored in storage device 110, or other non-volatile storage for later execution. In this manner, computer system 100 may obtain application code in the form of a carrier wave.

Figure 7:
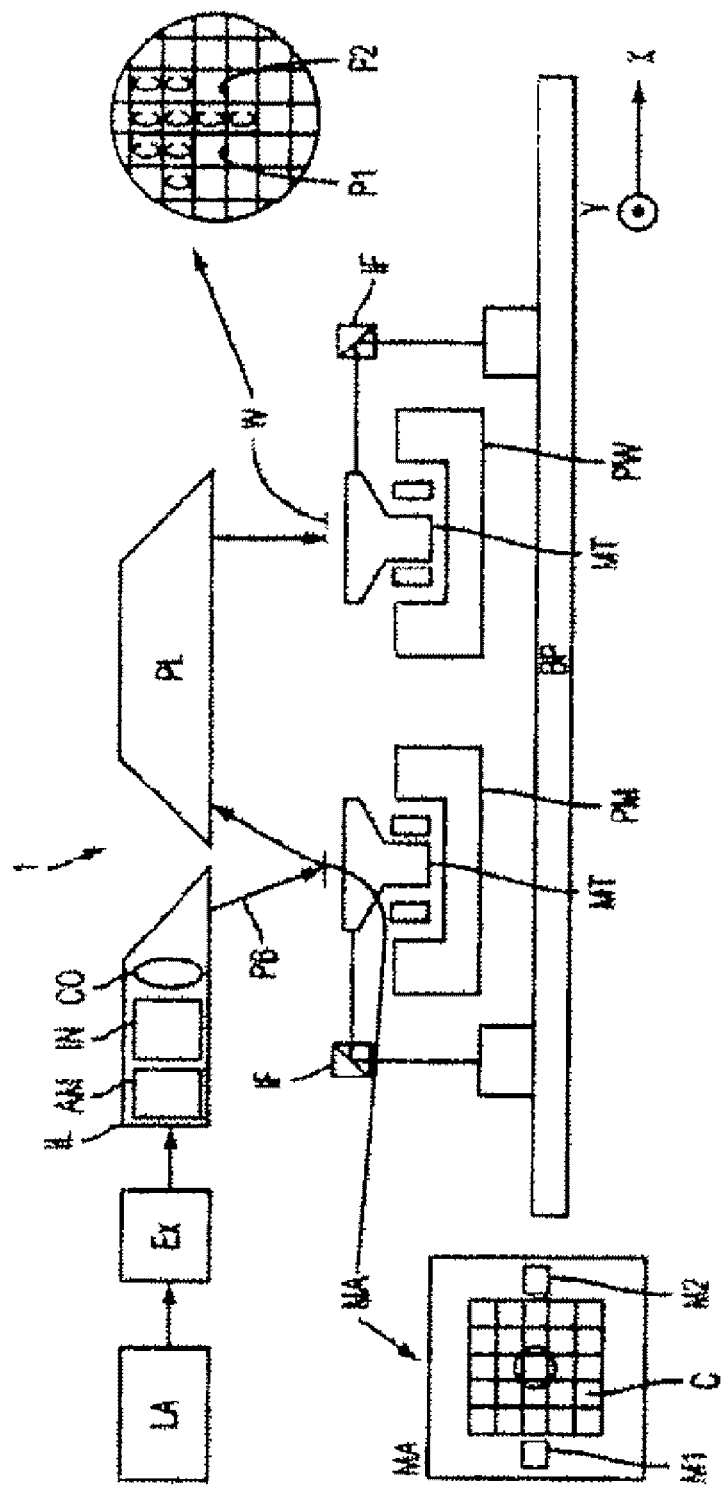
FIG. 7 schematically depicts a lithographic projection apparatus suitable for use with the method of the present invention.

FIG. 7 schematically depicts an exemplary lithographic projection apparatus for which lithographic processing can be simulated utilizing the process of present invention. The apparatus comprises:

- a radiation system Ex, IL, for supplying a projection beam PB of radiation. In this particular case, the radiation system also comprises a radiation source LA;
- a first object table (patterning device support or mask table) MT provided with a mask holder for holding a patterning device (e.g. mask) MA (e.g., a reticle), and connected to first positioner for accurately positioning the mask with respect to item PL;
- a second object table (substrate table) WT provided with a substrate holder for holding a substrate W (e.g., a resist-coated silicon wafer), and connected to second positioner for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted in FIG. 7, the apparatus is of a reflective type (i.e., has a reflective mask). However, in general, it may also be of a transmissive type, for example (with a transmissive mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed a conditioner, such as a beam expander Ex, for example. The illuminator IL may include an adjuster AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the patterning device (e.g. mask) MA has a desired uniformity and intensity distribution in its cross-section.

It should be noted with regard to FIG. 7 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the patterning device (e.g. mask) MA, which is held on a patterning device support (e.g. mask table) MT. After being reflected by the patterning device (e.g. mask) MA, the beam PB passes through the lens PL, which focuses the beam PB onto a target portion C of the substrate W. With the aid of the second positioner (and interferometric measuring means IF), the substrate table WT can be moved accurately, e.g. so as to position different target portions C in the path of the beam PB. Similarly, the first positioner can be used to accurately position the patterning device (e.g. mask) MA with respect to the path of the beam PB, e.g., after mechanical retrieval of the patterning device (e.g. mask) MA from a patterning device library, or during a scan. In general, movement of the object tables MT, WT will be realized with the aid of a long-stroke module (coarse positioning) and a short-stroke module (fine positioning), which are not explicitly depicted in FIG. 7. However, in the case of a wafer stepper (as opposed to a step-and-scan tool) the patterning device support (e.g. mask table) MT may just be connected to a short stroke actuator, or may be fixed.

The depicted tool can be used in two different modes:

In step mode, the patterning device support (e.g. mask table) MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device support (e.g. mask table) MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

What is claimed is:

1. A method for determining a difference between a reference image and a further image of a pattern, the method comprising:
   determining a reference imaging function;
   determining parameters of a difference function representative of a difference between the reference imaging function and a further imaging function;
   calculating a difference between the reference image and the further image of the pattern based on the difference function and the determined parameters; and
   determining the further imaging function based upon the reference imaging function and the difference function,
   wherein the further imaging function is determined by concatenating the reference imaging function and the difference function.

2. The method according to claim 1, wherein calculating the difference in the reference image and the further image of the pattern comprises determining the difference in image intensity of the reference image and the further image of the pattern.

3. The method according to claim 2, wherein calculating the difference in the reference image and the further image of the pattern further comprises determining the difference between a measure for critical dimensions in the reference image and the further image.

4. The method according to claim 1, comprising representing a plurality of the terms of the difference function in eigenfunctions and corresponding eigenvalues, and determining a simplified difference function by disregarding certain of the eigenfunctions and eigenvalues based upon the eigenvalues.

5. The method according to claim 4, wherein the simplified difference function comprises less than 300 eigenvalues or less than 100 eigenvalues.

6. The method according to claim 1, wherein the reference image models an image of the pattern formed by a reference optical system under reference conditions, and the further image models an image of the pattern formed by a further optical system, or formed by the reference optical system under further conditions, or formed by a modified reference optical system.

7. The method according to claim 6, comprising decreasing the difference between the reference image and the further image by changing the conditions of the further optical system, the reference optical system or the modified reference optical system.

8. The method according to claim 7, wherein the reference optical system is a projection system of a lithographic exposure apparatus.

9. A non-transitory computer readable medium having machine executable instructions stored thereon, the instructions to be executed by a machine to perform a method for determining a change in an image of a mask pattern as in any one of the preceding claims 1 to 8.

10. A method according to claim 1, wherein determining the reference imaging function comprises:
    determining a first matrix of transmission cross-coefficients (TCCs) associated with a base state of a reference optical system;
    diagonalizing the first matrix of TCCs to obtain a diagonalized set of TCC kernels, each having eigenfunctions and eigenvalues; and
    truncating the diagonalized set of TCC kernels based on the eigenvalues.

11. A method for determining a difference between a reference image and a further image of a pattern, the method comprising:
    determining a reference imaging function associated with a base set of optical settings of a first lithographic apparatus;
    determining a difference function associated with a difference between a perturbed state of optical settings of a second lithographic apparatus and the base set of optical settings of the first lithographic apparatus;
    determining a further imaging function based upon the reference imaging function and the difference function; and
    calculating the difference between the reference image and the further image using the reference imaging function and the further imaging function,
    wherein the further imaging function is determined by concatenating the reference imaging function and the difference function.

12. The method according to claim 11, wherein the first lithographic apparatus is a reference lithographic apparatus, and the second lithographic apparatus is a further lithographic apparatus.

13. The method according to claim 11, wherein the first lithographic apparatus and the second lithographic apparatus are the same reference lithographic apparatus.

14. A method according to claim 11, wherein determining the reference imaging function comprises:
    determining a first matrix of transmission cross-coefficients (TCCs) associated with the base state of the first lithographic apparatus;
    diagonalizing the first matrix of TCCs to obtain a diagonalized set of TCC kernels, each having eigenfunctions and corresponding eigenvalues; and truncating the diagonalized set of TCC kernels based on the eigenvalues.

15. A method according to claim 14, wherein determining the difference function comprises:
   determining a second matrix of transmission cross-coefficients (TCCs) associated with the perturbed state of second lithographic apparatus;
   subtracting the first matrix of TCCs from the second matrix of TCCs to obtain a third matrix of TCCs;
   diagonalizing the third matrix of TCCs to obtain a diagonalized set of delta TCC kernels, each having eigenfunctions and corresponding eigenvalues; and
   truncating the diagonalized set of delta TCC kernels based on the eigenvalues.

16. A method according to claim 15, wherein determining the further imaging function comprises concatenating together the diagonalized set of TCC kernels and the diagonalized set of delta TCC kernels.

17. A method according to claim 16, wherein calculating the difference comprises:
   calculating a reference aerial image using the reference imaging function;
   calculating a further aerial image using the further imaging function; and
   subtracting the reference aerial image from the further aerial image.

18. A method according to claim 16, wherein calculating the difference comprises:
   calculating a reference critical dimension using the reference imaging function;
   calculating a further critical dimension using the further imaging function; and
   subtracting the reference critical dimension from the further critical dimension.

* * * * *